(12) United States Patent  
Muto et al.

(10) Patent No.: US 9,087,778 B2
(45) Date of Patent: Jul. 21, 2015

(54) JOINING METHOD AND SEMICONDUCTOR DEVICE MANUFACTURING METHOD

(71) Applicant: MITSUBISHI ELECTRIC CORPORATION, Chiyoda-ku (JP)

(72) Inventors: Aya Muto, Chiyoda-ku (JP); Masayoshi Shinkai, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 14/250,546

(22) Filed: Apr. 11, 2014

(65) Prior Publication Data

US 2014/0217156 A1    Aug. 7, 2014

Related U.S. Application Data

(62) Division of application No. 13/655,875, filed on Feb. 10, 1920, now Pat. No. 8,746,538.

(30) Foreign Application Priority Data

Nov. 25, 2011   (JP) ................................. 2011-257090
Aug. 23, 2012   (JP) ................................. 2012-183833

(51) Int. Cl.
*B23K 31/02*     (2006.01)
*H01L 23/00*     (2006.01)
(Continued)

(52) U.S. Cl.
CPC .......... *H01L 24/27* (2013.01); *H01L 23/49513* (2013.01); *H01L 23/49541* (2013.01); *H01L 24/17* (2013.01); *H01L 24/29* (2013.01); *H01L 24/32* (2013.01); *H01L 24/81* (2013.01); *H01L 24/83* (2013.01); *B23K 1/0016* (2013.01);
(Continued)

(58) Field of Classification Search
None
See application file for complete search history.

(56) References Cited

U.S. PATENT DOCUMENTS 3,350,250 A * 10/1967 Sanz et al. .................... 156/150
4,294,396 A   10/1981 Obata et al.
(Continued)

FOREIGN PATENT DOCUMENTS

CN    1041067 A    4/1990
CN    1134607 A    10/1996
(Continued)

OTHER PUBLICATIONS

Chinese Office Action issued Feb. 28, 2015 in Chinese Patent Application No. 201210481118.1 w/partial English Translation.
(Continued)

*Primary Examiner* — Kiley Stoner
(74) *Attorney, Agent, or Firm* — Oblon, McClelland, Maier & Neustadt, L.L.P.

(57) ABSTRACT

A joining method that allows joining processing to be carried out simultaneously at a plurality of portions without being influenced by a supply time restriction on a joining material, and a semiconductor device manufacturing method using the joining method are provided. A chip and a lead frame are tentatively assembled having a solid solder block interposed therebetween. The solder block is provided with protruding parts that protrude in one direction. The protruding parts are inserted into solder supply ports of the lead frame, whereby the chip and the lead frame are tentatively assembled. Subsequently, the chip and the lead frame are fed into a reflow oven, and the solder block is melted and thereafter solidified. Thus, the chip and the lead frame are joined to each other.

2 Claims, 10 Drawing Sheets

(51) Int. Cl.
*H01L 23/495* (2006.01)
*B23K 1/00* (2006.01)

(52) U.S. Cl.
CPC ....... *H01L24/16* (2013.01); *H01L 2224/16245* (2013.01); *H01L 2224/1703* (2013.01); *H01L 2224/17051* (2013.01); *H01L 2224/2747* (2013.01); *H01L 2224/291* (2013.01); *H01L 2224/296* (2013.01); *H01L 2224/29019* (2013.01); *H01L 2224/2957* (2013.01); *H01L 2224/29561* (2013.01); *H01L 2224/32245* (2013.01); *H01L 2224/33151* (2013.01); *H01L 2224/33181* (2013.01); *H01L 2224/811* (2013.01); *H01L 2224/8121* (2013.01); *H01L 2224/81192* (2013.01); *H01L 2224/81815* (2013.01); *H01L 2224/8321* (2013.01); *H01L 2224/83101* (2013.01); *H01L 2224/83104* (2013.01); *H01L 2224/83141* (2013.01); *H01L 2224/83191* (2013.01); *H01L 2224/83192* (2013.01); *H01L 2224/83385* (2013.01); *H01L 2224/83815* (2013.01); *H01L 2224/83951* (2013.01); *H01L 2924/351* (2013.01)

(56) References Cited

U.S. PATENT DOCUMENTS

| | | | |
|---|---|---|---|
| 4,664,309 A | | 5/1987 | Allen et al. |
| 4,716,272 A | * | 12/1987 | Blad et al. ............ 219/129 |
| 5,071,174 A | | 12/1991 | Griffin et al. |
| 5,387,815 A | * | 2/1995 | Nishiguchi ............ 257/704 |
| 5,560,534 A | * | 10/1996 | Okada et al. ............ 228/37 |
| 5,779,134 A | | 7/1998 | Watson et al. |
| 5,849,608 A | | 12/1998 | Abe |
| 5,878,939 A | * | 3/1999 | Luchinger et al. ............ 228/33 |
| 5,954,262 A | | 9/1999 | Inoue et al. |
| 5,971,058 A | * | 10/1999 | Bolde et al. ............ 164/130 |
| 5,984,166 A | * | 11/1999 | Holzmann ............ 228/254 |
| 6,425,518 B1 | * | 7/2002 | Gruber et al. ............ 228/256 |
| 6,589,594 B1 | | 7/2003 | Hembree |
| 8,117,982 B2 | * | 2/2012 | Gruber et al. ............ 118/301 |
| 8,210,424 B2 | | 7/2012 | Weibezahn |
| 2001/0000906 A1 | | 5/2001 | Yoshikawa et al. |
| 2002/0092894 A1 | | 7/2002 | Wang et al. |
| 2003/0178717 A1 | | 9/2003 | Singh |
| 2003/0207213 A1 | | 11/2003 | Farnworth |
| 2004/0035907 A1 | | 2/2004 | Radeck |
| 2004/0164124 A1 | | 8/2004 | Lundstrom et al. |
| 2004/0183175 A1 | | 9/2004 | Terui et al. |
| 2005/0045701 A1 | | 3/2005 | Shindo et al. |
| 2005/0067472 A1 | | 3/2005 | Ohtsuki et al. |
| 2005/0082350 A1 | | 4/2005 | Tarui et al. |
| 2005/0121500 A1 | | 6/2005 | Schenk et al. |
| 2006/0012055 A1 | | 1/2006 | Foong et al. |
| 2007/0051777 A1 | * | 3/2007 | Yamaguchi et al. .......... 228/101 |
| 2007/0199926 A1 | * | 8/2007 | Watanabe et al. ........ 219/121.64 |
| 2008/0230879 A1 | | 9/2008 | Sharma et al. |
| 2009/0145950 A1 | | 6/2009 | Lam et al. |
| 2010/0282823 A1 | * | 11/2010 | Ulicny et al. ............ 228/199 |
| 2011/0001222 A1 | | 1/2011 | Nishimura et al. |

FOREIGN PATENT DOCUMENTS

| | | | |
|---|---|---|---|
| JP | 55-016722 A | | 2/1980 |
| JP | 01-009629 A | | 1/1989 |
| JP | 01-290295 A | * | 11/1989 |
| JP | 02-203540 A | | 8/1990 |
| JP | 05-264576 A | | 10/1993 |
| JP | 09-321212 A | | 12/1997 |
| JP | 2002-305372 A | * | 10/2002 |
| JP | 2008-182074 | | 8/2008 |
| JP | 2010-92918 | | 4/2010 |
| JP | 4640345 B2 | | 3/2011 |
| WO | WO 2006/019461 | | 2/2006 |

OTHER PUBLICATIONS

Japanese Office Action issued May 12, 2015 in Japanese Patent Application No. 2012-183833 w/English translation.

* cited by examiner

JOINING METHOD AND SEMICONDUCTOR DEVICE MANUFACTURING METHOD

CROSS-REFERENCE TO RELATED APPLICATIONS

This application is a divisional of application Ser. No. 13/655,875, filed Oct. 19, 2012, now U.S. Pat. No. 8,746,538, which claims priority to Japanese patent application nos. 2011-257090 filed Nov. 25, 2011 and 2012-183833 filed Aug. 23, 2012, the entire contents of each of which are incorporated herein by reference.

BACKGROUND OF THE INVENTION

1. Field of the Invention

The present invention relates to a joining method for joining two joining target members, e.g., a lead frame and a chip of a semiconductor device, with solder or the like, and to a semiconductor device manufacturing method using the same.

2. Description of the Background Art

Two joining target members, e.g., a lead frame and a semiconductor chip (which hereinafter may simply be referred to as the "chip") of a semiconductor device are joined to each other with a joining material such as solder. According to joining methods of conventional techniques, a heat spreader on which a lead frame and a chip are mounted is tentatively assembled before being put into an oven, and molten solder is supplied from a solder supply source in the oven. By solidifying the supplied molten solder, the lead frame and the chip are joined to each other (for example, see Japanese Patent Application Laid-Open No. 2008-182074).

According to the joining methods of the conventional techniques such as disclosed in Japanese Patent Application Laid-Open No. 2008-182074, since the solder supply source supplying the solder is provided one in number, the solder cannot be supplied to a plurality of portions at once. In the case where the solder is supplied to a plurality of portions, the molten solder must be supplied to those portions one by one in order, and hence it takes time.

Further, since the heat must be retained while the molten solder is supplied, the base material of the chip may be influenced by the molten solder at the portions where the molten solder has already been supplied. For the purpose of suppressing the influence, the heating time and the processing speed in the joining processing are restricted. Therefore, the time from when the supply of solder is started in the oven until when the supply ends is restricted. This is referred to as the supply time restriction. The supply time restriction poses a problem that the number of chips mounted on a semiconductor device cannot be increased.

SUMMARY OF THE INVENTION

The present invention is directed to provide a joining method that makes it possible to carry out joining processing simultaneously at a plurality of portions without the influence of the supply time restriction on the joining material and a semiconductor device manufacturing method using the same.

A joining method of the present invention includes an arranging step and a joining step. In the arranging step, a solid joining material is arranged between two joining target members. In the joining step, by the joining material being molten and thereafter solidified, the two joining target members are joined to each other.

According to the joining method, the joining processing can be carried out simultaneously at a plurality of portions without the influence of the supply time restriction on the joining material.

A joining method of the present invention includes a tentatively assembling step and a joining step. In the tentatively assembling step, two joining target members are tentatively assembled to oppose to each other with an interval. In the joining step, by a molten joining material being supplied by supplying means into a space formed by the two joining target members, and thereafter solidified, the two joining target members are joined to each other. The supplying means is structured to be capable of supplying the joining material simultaneously to a plurality of portions.

According to the joining method, the joining processing can be carried out simultaneously at a plurality of portions without the influence of the supply time restriction on the joining material.

A semiconductor device manufacturing method of the present invention includes a step of joining, using the joining method of the present invention, a semiconductor chip having a semiconductor element and a lead frame having a lead wire connected to a semiconductor element to each other, the semiconductor chip and the lead frame being the two joining target members.

According to the semiconductor device manufacturing method, using the joining method which, as described above, makes it possible to carry out the joining processing simultaneously at a plurality of portions without the influence of the supply time restriction on the joining material, the semiconductor chip and the lead frame are joined to each other. Accordingly, the number of pieces of the semiconductor chip mounted on the semiconductor device can be increased.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
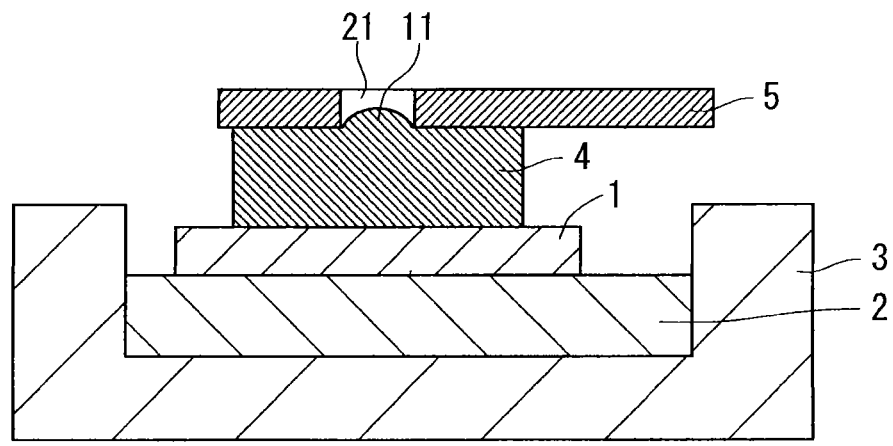
FIG. 1 is a cross-sectional view showing the structure in a tentatively assembled state in a joining method according to a first preferred embodiment of the present invention.
Figure 2:
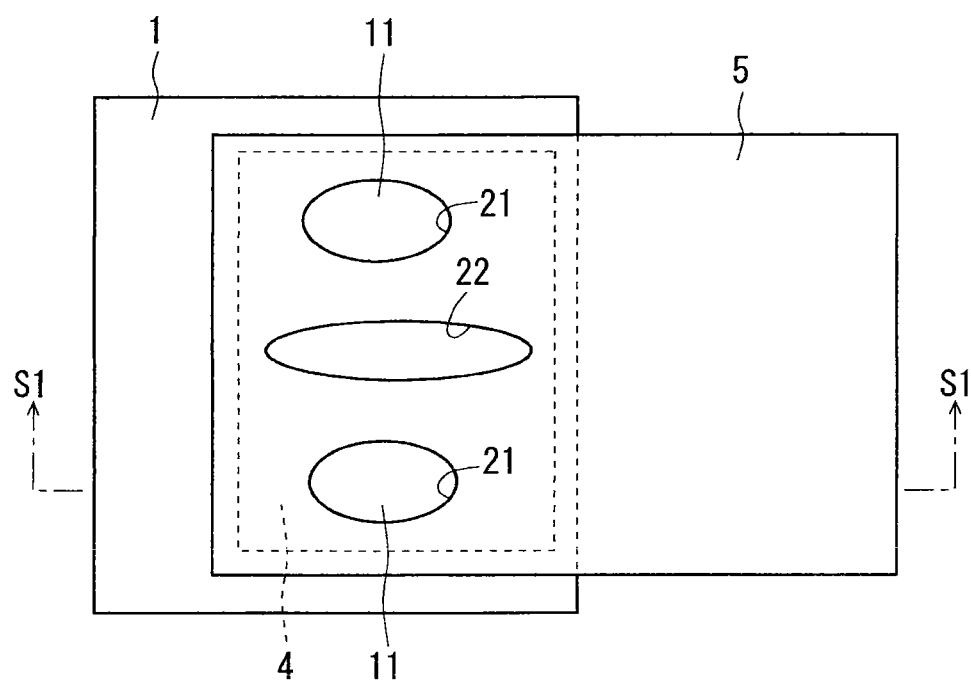
FIG. 2 is a plan view showing the structure in a tentatively assembled state in the joining method according to the first preferred embodiment of the present invention.

FIG. 1 is a cross-sectional view showing the structure in a tentatively assembled state in a joining method according to a first preferred embodiment of the present invention. FIG. 2 is a plan view showing the structure in a tentatively assembled state in the joining method according to the first preferred embodiment of the present invention. FIG. 1 is a cross-sectional view taken along cross-sectional line S1-S1 in FIG. 2. For the sake of easier understanding, a heat spreader 2 and a dedicated jig 3 are not shown in FIG. 2.

In the tentatively assembled state, the heat spreader 2 to which a semiconductor chip (which hereinafter may simply be referred to as the "chip") 1 is soldered is assembled into the dedicated jig 3. The chip 1 is plate-like. The chip 1 has its surface on one side in the thickness direction soldered to the heat spreader 2. On the chip 1, that is, on the other side in the thickness direction of the chip 1, a lead frame 5 is arranged via a solder block 4. The lead frame 5 is supported by not-shown supporting means, e.g., a robot arm or a fixing member.

The lead frame 5 is provided with solder supply ports 21. In the present preferred embodiment, two solder supply ports 21 are formed. One slit 22 is formed between the two solder supply ports 21. The lead frame 5 is plate-like, and the solder supply ports 21 and the slit 22 penetrate the lead frame 5 in the thickness direction. The solder supply ports 21 and the slit 22 are each formed to be oval as seen from the other side in the thickness direction of the lead frame 5.

The solder block 4 is made of solid solder. In the present preferred embodiment, the solder block 4 is in a rectangular parallelepiped shape. At the top of the solder block 4, that is, on the surface on the other side in the thickness direction which is the side in contact with the lead frame 5, protruding parts 11 are formed. The protruding parts 11 are formed at the position corresponding to the solder supply ports 21 of the lead frame 5. The protruding parts 11 are formed as many as the solder supply ports 21 of the lead frame 5. In the present preferred embodiment, two protruding parts 11 are formed.

The protruding parts 11 are formed to have the same shape as seen from the other side in the thickness direction as the solder supply ports 21 of the lead frame 5. In the present preferred embodiment, the protruding parts 11 are each formed to be oval as seen from the other side in the thickness direction. The protruding parts 11 are inserted into the respective corresponding solder supply ports 21 of the lead frame 5.

Figure 3:
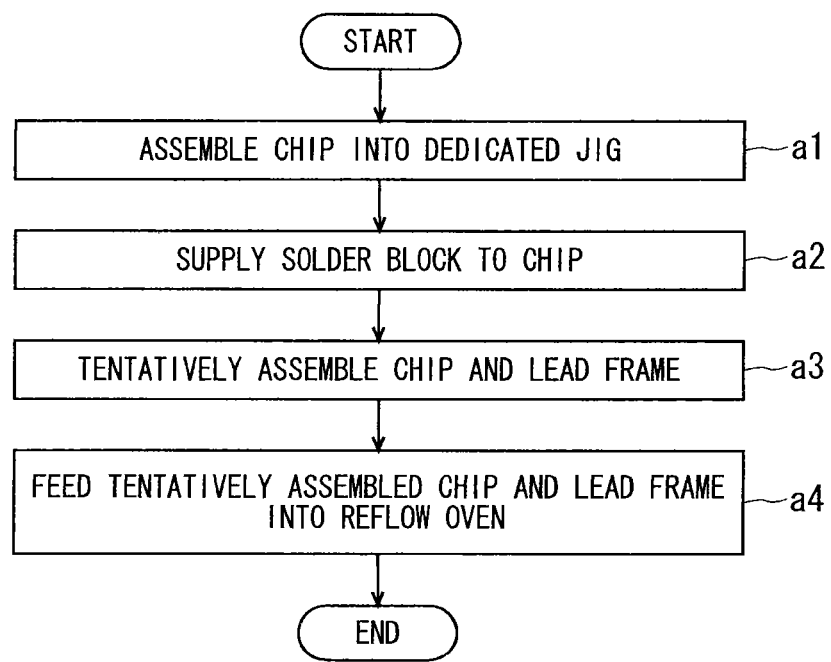
FIG. 3 is a flowchart showing the processing procedure in the joining method according to the first preferred embodiment of the present invention.

FIG. 3 is a flowchart showing the processing procedure in the joining method according to the first preferred embodiment of the present invention. When materials and tools used in the joining method according to the present preferred embodiment, such as the chip 1, the heat spreader 2, the dedicated jig 3, the solder block 4, the lead frame 5 and the like shown in FIG. 1, are prepared, the processing starts and proceeds to Step a1.

In Step a1, after the chip 1 is soldered to the heat spreader 2, the heat spreader 2 to which the chip 1 is soldered is assembled into the dedicated jig 3.

In Step a2, the solder block 4 is placed on the chip 1. The solder block 4 is placed on the chip 1 such that the surface opposite to the surface where the protruding parts 11 are formed is brought into contact with the chip 1. In this manner, the solder block 4 is supplied to the chip 1. The solder block 4 is previously formed by re-melting using a mask or a mold.

In Step a3, the lead frame 5 is placed such that the protruding parts 11 of the solder block 4 are inserted into the solder supply ports 21, whereby the chip 1 and the lead frame 5 are tentatively assembled. The step of Step a3 corresponds to the tentatively assembling step.

After the tentative assembly is completed, in Step a4, the tentatively assembled chip 1 and lead frame 5 are fed in a reflow oven to carry out soldering. Since the inside of the reflow oven is heated, by placing the tentatively assembled chip 1 and lead frame 5 in the reflow oven, the solder block 4 is heated and melt. Thereafter, the tentatively assembled chip 1 and lead frame 5 are taken out from the reflow oven and cooled, so that the molten solder block 4 solidifies. Thus, the chip 1 and the lead frame 5 are joined to each other. The step of Step a4 corresponds to the joining step.

As described above, in the present preferred embodiment, the protruding parts 11 of the solder block 4 placed on the chip 1 are inserted into the solder supply ports 21 of the lead frame 5, whereby the chip 1 and the lead frame 5 are tentatively assembled. Thus, the protruding parts 11 of the solder block 4 inserted into the solder supply ports 21 achieve alignment. Therefore, even when the tentatively assembled chip 1 and the lead frame 5 vibrate when being conveyed inside the reflow oven, the solder block 4 will not displace. Accordingly, the chip 1 and the lead frame 5 are stably joined to each other. That is, the chip 1 and the lead frame 5 can accurately be joined to each other at a plurality of portions.

Further, in the present preferred embodiment, before the chip 1 and the lead frame 5 are fed into the reflow oven, solder as the solder block 4 is supplied between the chip 1 and the lead frame 5. Therefore, without being influenced by the supply time restriction on the solder in the reflow oven, the joining processing can simultaneously be carried out at a plurality of portions.

Still further, in the present preferred embodiment, since the solder block 4 being the solid solder is used, variations in the supply amount of the solder can be suppressed to the minimum extent.

Still further, in the present preferred embodiment, the slit 22 is formed between the two solder supply ports 21 of the lead frame 5. Thus, when the solder block 4 is heated in the reflow oven to be re-molten, the solder being molten (which hereinafter may be referred to as the "molten solder") can take a fillet shape which spreads in a bell-shape manner from each solder supply port 21 as an apex toward the chip 1 side, and whose cross-sectional shape has tapered portions.

Accordingly, since the thermal stress at the portion joined by solder (which hereinafter may be referred to as the "solder-joined portion") can be relaxed, it becomes possible to prevent the solder-joined portion and the chip 1 from being damaged by the thermal stress occurring upon operation of the semiconductor device, and to extend the lifetime of the semiconductor device.

The shape of the solder block 4 is not limited to a rectangular parallelepiped shape, and any shape that includes the protruding parts 11 may suffice. For example, it may be in various shapes such as a quadrangular pyramid shape, a spherical shape or the like. Use of the solder block 4 in such shapes can similarly achieve the effect of the present preferred embodiment.

Second Preferred Embodiment

Figure 4:
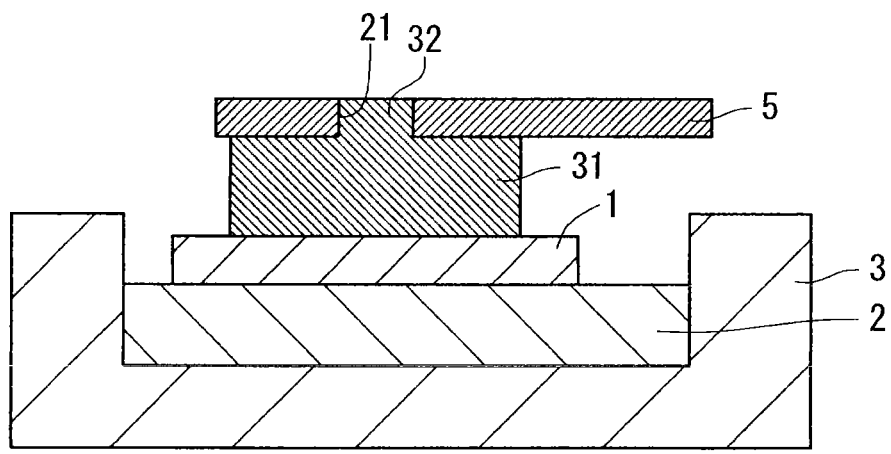
FIG. 4 is a cross-sectional view showing the structure in a tentatively assembled state in a joining method according to a second preferred embodiment of the present invention.

FIG. 4 is a cross-sectional view that shows the structure in a tentatively assembled state in a joining method according to a second preferred embodiment of the present invention. Since the structure in the tentatively assembled state according to the present preferred embodiment is similar to the structure in the tentatively assembled state according to the first preferred embodiment described above, a description will be given of the different parts, and the corresponding parts are denoted by identical reference symbols and the common description will not be repeated.

In the present preferred embodiment, in place of the solder block 4 according to the first preferred embodiment, a plate solder 31 is used. The plate solder 31 is made of a plate-shaped solid solder. The plate solder 31 is placed on the chip 1 such that the surface on one side in the thickness direction is brought into contact with the chip 1. The plate solder 31 is provided with protruding parts 32 on the opposite surface which is brought into contact with the chip 1, that is, on the surface that is on the other side in the thickness direction and that is the side brought into contact with the lead frame 5.

The protruding parts 32 of the plate solder 31 are formed, similarly to the protruding parts 11 of the solder block 4 in the first preferred embodiment, two in number in total, at the positions corresponding to the two solder supply ports 21 of the lead frame 5, respectively. The plate solder 31 is obtained by deforming plate-shaped solid solder using a mold or the like, to thereby forming the protruding parts 32.

The lead frame 5 is arranged such that the protruding parts 32 of the plate solder 31 are inserted into the respective corresponding solder supply ports 21 of the lead frame 5. In the present preferred embodiment, except for the use of the plate solder 31 in place of the solder block 4, the chip 1 and the lead frame 5 are joined to each other in the manner similar to the first preferred embodiment.

In the present preferred embodiment, similarly to the first preferred embodiment described above, the protruding parts 32 of the plate solder 31 placed on the chip 1 are inserted into the solder supply ports 21 of the lead frame 5, whereby the chip 1 and the lead frame 5 are tentatively assembled. Accordingly, similarly to the first preferred embodiment, the effect of stably joining the chip 1 and the lead frame 5 to each other can be achieved.

Further, in the present preferred embodiment, similarly to the first preferred embodiment, before the chip 1 and the lead frame 5 are fed into the reflow oven, the plate solder 31 is supplied between the chip 1 and the lead frame 5. This achieves the effect similar to that of the first preferred embodiment in that the joining processing can simultaneously be carried out at a plurality of portions without being influenced by the supply time restriction on the solder in the reflow oven.

Still further, being different from the solder block 4 used in the first preferred embodiment, the plate solder 31 used in the present preferred embodiment can be manufactured by deformation using a simple apparatus whose space required for installation is small. Accordingly, the entire joining apparatus including the manufacturing apparatus of the plate solder 31 can be minimized.

In the present preferred embodiment, while the plate solder 31 having the protruding parts 32 is manufactured by deforming the plate solder so as to form the protruding parts 32, the method for manufacturing the plate solder 31 having the protruding parts 32 is not limited thereto. For example, the plate solder 31 having the protruding parts 32 may be manufactured by placing paste-like solder on the plate solder and thereby forming the protruding parts 32, without deforming the plate solder. Use of the plate solder 31 provided with the protruding parts 32 formed in this manner can achieve the effect similar to that achieved by the present preferred embodiment.

Third Preferred Embodiment

Figure 5:
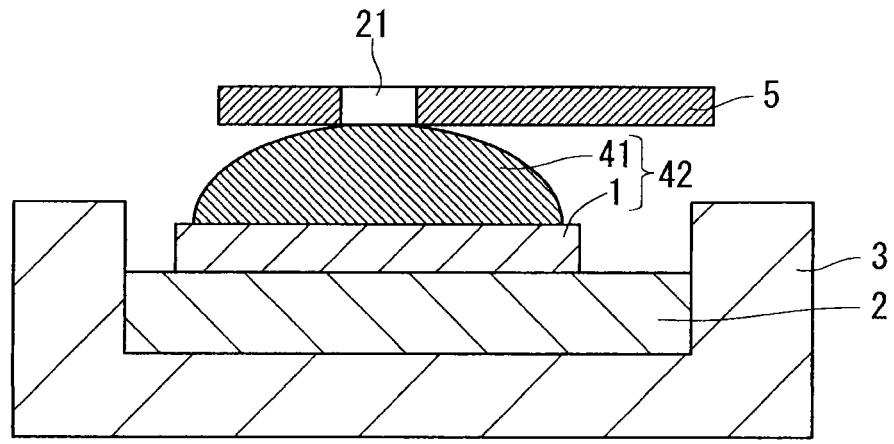
FIG. 5 is a cross-sectional view showing the structure in a tentatively assembled state in a joining method according to a third preferred embodiment of the present invention.

FIG. 5 is a cross-sectional view showing the structure in a tentatively assembled state in a joining method according to a third preferred embodiment of the present invention. Since the structure in the tentatively assembled state according to the present preferred embodiment is similar to the structure in the tentatively assembled state according to the first preferred embodiment described above, a description will be given of the different parts, and the corresponding parts are denoted by identical reference symbols and the common description will not be repeated.

In the present preferred embodiment, in place of the solder block 4 according to the first preferred embodiment, solder 41 that is previously soldered to the chip 1 is used. The chip 1 is tentatively assembled as a soldered chip 42 to which the solder 41 is previously soldered. The lead frame 5 is tentatively assembled by being arranged such that the solder 41 of the soldered chip 42 is exposed at the solder supply ports 21.

Figure 6:
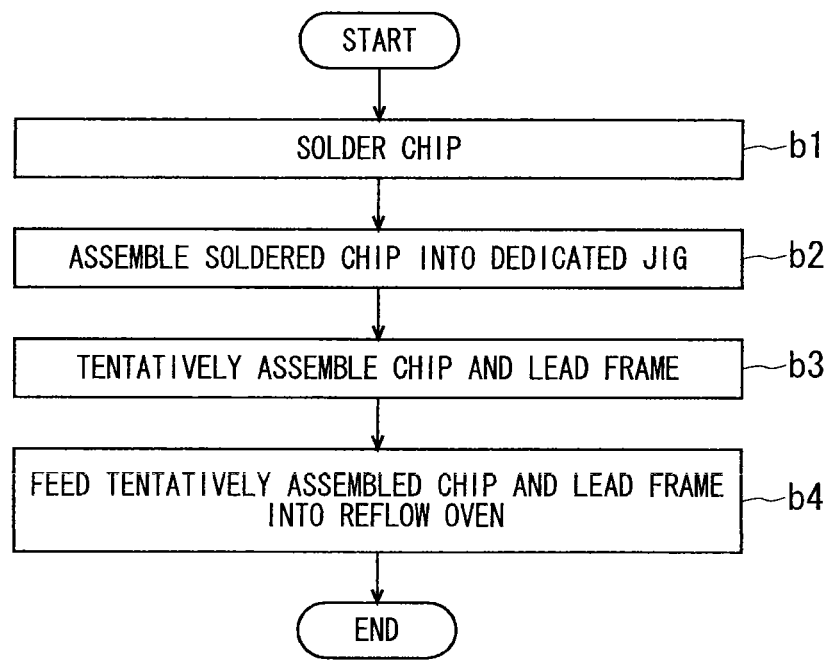
FIG. 6 is a flowchart showing the processing procedure in the joining method according to the third preferred embodiment of the present invention.

FIG. 6 is a flowchart showing the processing procedure in the joining method according to the third preferred embodiment of the present invention. When materials and tools used in the joining method according to the present preferred embodiment, such as the chip 1, the heat spreader 2, the dedicated jig 3, the solder 41, the lead frame 5 and the like shown in FIG. 5, are prepared, the processing starts and proceeds to Step b1.

In Step b1, after the molten solder 41 is supplied to the chip 1, the solder 41 is solidified to thereby manufacture the soldered chip 42. In this manner, the soldered chip 42 to which the solid solder 41 is bonded is obtained. The step of Step b1 corresponds to the bonding step. In Step b2, the chip 1 having been soldered in Step b1, i.e., the soldered chip 42, is assembled into the dedicated jig 3.

In Step b3, the lead frame 5 is placed such that the solder 41 of the soldered chip 42 is exposed at the solder supply ports 21, whereby the chip 1 and the lead frame 5 are tentatively assembled. The step of Step b3 corresponds to the tentatively assembling step. In Step b4, the tentatively assembled chip 1 and lead frame 5 are fed into the reflow oven to carry out soldering. The step of Step b4 corresponds to the joining step.

As described above, in the present preferred embodiment, similarly to the first preferred embodiment described above, the solder 41 is supplied between the chip 1 and the lead frame 5 before the chip 1 and the lead frame 5 are fed into the reflow oven. This achieves the effect similar to that of the first preferred embodiment in that the joining processing can simultaneously be carried out at a plurality of portions without being influenced by the supply time restriction on the solder in the reflow oven.

Still further, since the soldered chip 42 is used in the present preferred embodiment, being different from the first and second preferred embodiments, it does not involve the trouble of inserting the protruding parts 11 of the solder block 4 or the protruding parts 32 of the plate solder 31 into the solder supply ports 21 of the lead frame 5. Accordingly, as compared with the first and second preferred embodiments, the chip 1 and the lead frame 5 can be joined to each other more easily.

Figure 7:
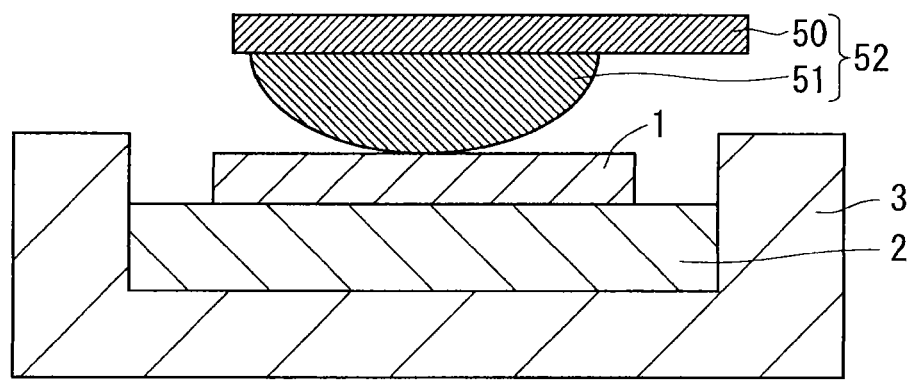
FIG. 7 is a cross-sectional view showing the structure in a tentatively assembled state in a joining method according to a modification of the third preferred embodiment of the present invention.

FIG. 7 is a cross-sectional view showing the structure in a tentatively assembled state in a joining method according to a modification of the third preferred embodiment of the present invention. In the modification of the third preferred embodiment, soldering may previously be carried out to the lead frame 50 instead of the chip 1. For example, as shown in FIG. 7, a soldered lead frame 52 in which solder 51 is previously soldered to the chip 1 may be used. In the present modification, except for the use of the soldered lead frame 52 shown in FIG. 7 in place of the soldered chip 42 shown in FIG. 5 described above, joining can be carried out in the similar manner as in the third preferred embodiment. Also in the present modification, the effect similar to that achieved by the third preferred embodiment can be achieved.

Fourth Preferred Embodiment

Figure 8:
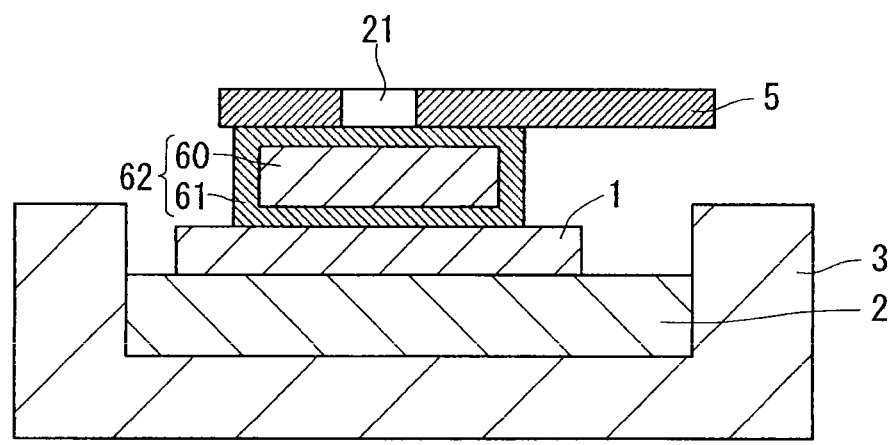
FIG. 8 is a cross-sectional view showing the structure in a tentatively assembled state in a joining method according to a fourth preferred embodiment of the present invention.

FIG. 8 is a cross-sectional view showing the structure in a tentatively assembled state in a joining method according to a fourth preferred embodiment of the present invention. Since the structure of the tentatively assembled state according to the present preferred embodiment is similar to the structure in the tentatively assembled state according to the first preferred embodiment described above, a description will be given of the different parts, and the corresponding parts are denoted by identical reference symbols and the common description will not be repeated.

In the present preferred embodiment, in place of the solder block 4 according to the first preferred embodiment, a metal plate plated with solder (which hereinafter may be referred to as the "solder-plated metal plate") 62 is used. In the solder-plated metal plate 62, on the surface of a metal plate 60 serving as the base material, a solder-plating layer 61 is formed by solder plating. In other words, the solder-plated metal plate 62 is structured to include the metal plate 60 and the solder-plating layer 61. The solder-plated metal plate 62 corresponds to the joining material, and the solder-plating layer 61 corresponds to the plating layer.

In the present preferred embodiment, except for the use of the solder-plated metal plate 62 in place of the solder block 4, joining of the chip 1 and the lead frame 5 is carried out in the similar manner as in the first preferred embodiment. When the chip 1 and the lead frame 5 are tentatively assembled, the solder-plated metal plate 62 is arranged such that the solder-plating layer 61 is brought into contact with the chip 1 and the lead frame 5.

As described above, in the present preferred embodiment, similarly to the first preferred embodiment described above, the solder-plated metal plate 62 is supplied between the chip 1 and the lead frame 5 before the chip 1 and the lead frame 5 are fed into the reflow oven. This achieves the effect similar to that of the first preferred embodiment in that the joining processing can simultaneously be carried out at a plurality of portions without being influenced by the supply time restriction on the solder in the reflow oven.

Still further, in the present preferred embodiment, the solder is used only for the solder-plating layer 61 on the surface of the solder-plated metal plate 62. Therefore, the amount of the solder being used can be saved. Accordingly, a reduction in costs required for joining the chip 1 and the lead frame 5 to each other can be achieved.

Though the metal plate 60 that is plated with solder is used as a joining material in the present preferred embodiment, without being limited thereto, the metal plate 60 that is plated with a joining raw material other than solder may be used. It suffices that the joining raw material serves to join the chip 1, the lead frame 5, and the metal plate 60 to each other. For example, the metal plate 60, which is obtained by plating with a brazing material, or the metal plate 60, which is obtained by plating with a metal or an alloy having a lower melting point than those of the materials of the chip 1, the lead frame 5 and the metal plate 60, may be used as the joining material.

That is, a joining material including, on the surface of the metal plate 60, a plating layer of a joining raw material other than solder in place of the solder-plating layer 61 may be used. For example, a joining material including a layer plated with a brazing material or a layer plated with a metal or an alloy having a lower melting point than those of the materials of the chip 1, the lead frame 5 and the metal plate 60 may be used. In the cases where such joining materials are employed, the effect similarly to that in the present preferred embodiment can be achieved.

Fifth Preferred Embodiment

Figure 9:
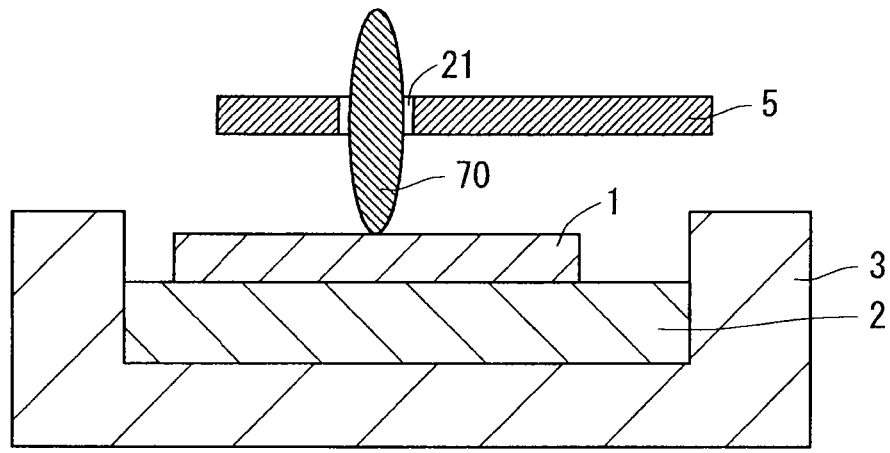
FIG. 9 is a cross-sectional view showing the structure in a tentatively assembled state in a joining method according to a fifth preferred embodiment of the present invention.

FIG. 9 is a cross-sectional view showing the structure in a tentatively assembled state in a joining method according to a fifth preferred embodiment of the present invention. Since the structure in the tentatively assembled state according to the present preferred embodiment is similar to the structure in the tentatively assembled state according to the first preferred embodiment described above, a description will be given of the different parts, and the corresponding parts are denoted by identical reference symbols and the common description will not be repeated.

In the present preferred embodiment, solid solder 70 is used in place of the solder block 4 according to the first preferred embodiment. The solid solder 70 is in a substantially cylindrical shape. In the following, the solid solder 70 may be referred to as the "columnar solder 70". The solid solder 70 is made of solid state solder. The solid solder 70 is previously manufactured in the similar method as that for the solder block 4 according to the first preferred embodiment described above and used.

The solid solder 70 is in an oblate ellipsoid shape. The solid solder 70 is inserted in the solder supply ports 21 of the lead frame 5 such that its long axis direction agrees with the thickness direction of the chip 1 and the lead frame 5. Specifically, the solid solder 70 is arranged so as to be inserted into the solder supply ports 21.

Figure 10:
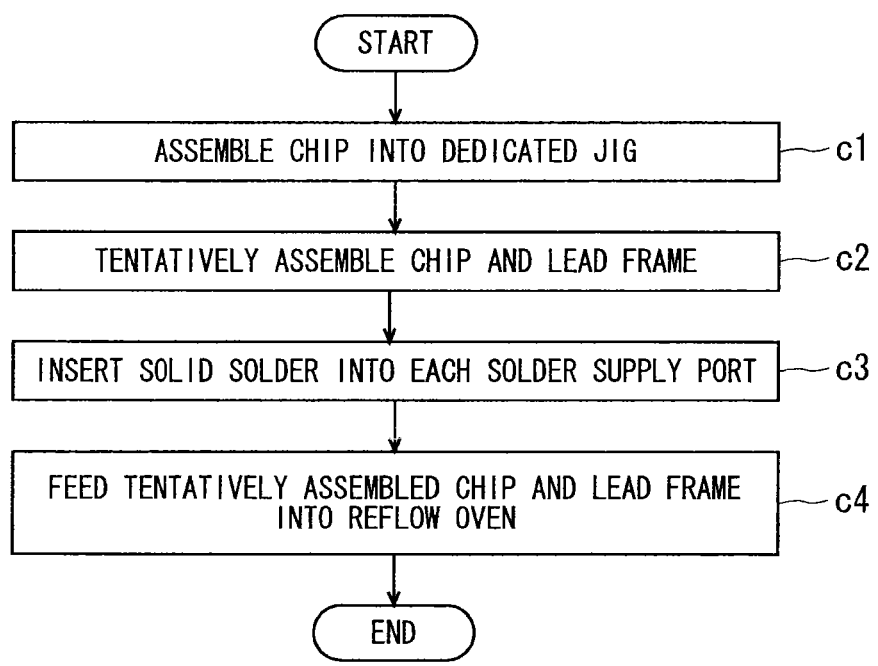
FIG. 10 is a flowchart showing the processing procedure in the joining method according to the fifth preferred embodiment of the present invention.

FIG. 10 is a flowchart showing the processing procedure in the joining method according to the fifth preferred embodiment of the present invention. When materials and tools used in the joining method according to the present preferred embodiment, such as the chip 1, the heat spreader 2, the dedicated jig 3, the solid solder 70, the lead frame 5 and the like shown in FIG. 9, are prepared, the processing starts and proceeds to Step c1.

In Step c1, similarly to the first preferred embodiment described above, after the chip 1 is soldered to the heat spreader 2, the heat spreader 2 to which the chip 1 is soldered is assembled into the dedicated jig 3.

In Step c2, being different from the first preferred embodiment, the chip 1 and the lead frame 5 are tentatively assembled by placing the lead frame 5 above the chip 1 without having the solder block 4 interposed therebetween. The lead frame 5 is supported by not-shown supporting means, e.g., a robot arm or a fixing member, and placed above the chip 1. The step of Step c2 corresponds to the tentatively assembling step.

After the tentative assembly, in Step c3, the substantially cylindrically shaped solid solder 70 is inserted into each of the solder supply ports 21 of the lead frame 5, and fed into the reflow oven in Step c4. The step of Step c3 corresponds to the supplying step, and the step of Step c4 corresponds to the joining step.

As described above, in the present preferred embodiment, similarly to the first preferred embodiment described above, the solder is supplied by inserting the solid solder 70 into the solder supply ports 21 of the lead frame 5 before the chip 1 and the lead frame 5 are fed into the reflow oven. This achieves the effect similar to that of the first preferred embodiment in that the joining processing can simultaneously be carried out at a plurality of portions without being influenced by the supply time restriction on the solder in the reflow oven.

Further, since the solid solder 70 being substantially cylindrically shaped columnar solder is used in the present preferred embodiment, as compared to the case where the solder block 4 is used, the supply amount of the solder can be reduced. Accordingly, it is effective in the case where the area joined by the joining material such as solder (which hereinafter may be referred to as the "joining area") is relatively small.

Since the solder supply source employed in the joining method of conventional technique such as disclosed in Japanese Patent Application Laid-Open No. 2008-182074 described above is associated with variations attributed to the structure, it is difficult to finely adjust the supply amount of solder. Accordingly, in the case where solder is discharged in a small amount and applied, such as in the case where a relatively small chip is soldered, the applied amount will vary, which invites troubles.

Accordingly, what is required is a joining method that can suppress variations in the supply amount of the joining material to the joining target member such as the chip 1 irrespective of the size of the joining area, and that can carry out joining evenly and simultaneously at a plurality of portions even when the joining area is reduced due to miniaturization of the joining target member.

In the present preferred embodiment, as described above, since the supply amount of the joining material such as solder can be made relatively small, variations in the supply amount of the joining material to the joining target member such as the chip 1 can be suppressed irrespective of the size of the joining area. Further, even when the joining area is reduced due to miniaturization of the joining target member, joining can be carried out evenly and simultaneously at a plurality of portions.

Figure 11:
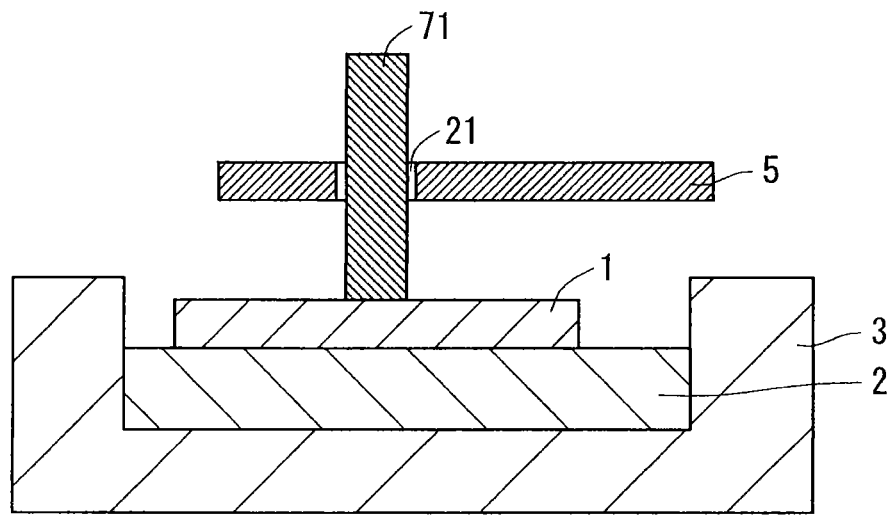
FIG. 11 is a cross-sectional view showing the structure in a tentatively assembled state in a joining method according to a modification of the fifth preferred embodiment of the present invention.

FIG. 11 is a cross-sectional view showing the structure in a tentatively assembled state in a joining method according to a modification of the fifth preferred embodiment of the present invention. A solder wire 71 being a cylindrical solid solder that is shown in FIG. 11 may be employed in place of the solid solder 70 being a substantially cylindrical shape columnar solder that is shown in FIG. 9 described above in the modification of the fifth embodiment of the present invention. Also in the case where the solder wire 71 is used as in the present modification, the effect similar to that achieved by the fifth preferred embodiment can be achieved. Further, when the solder wire 71 is used, the involved work is only cutting of the solder. Therefore, as compared to the case where the substantially cylindrically shaped columnar solder 70 is used in the fifth preferred embodiment, the work can be carried out in an easier manner. The solder wire 71 corresponds to the wire-like joining material.

Sixth Preferred Embodiment

Figure 12:
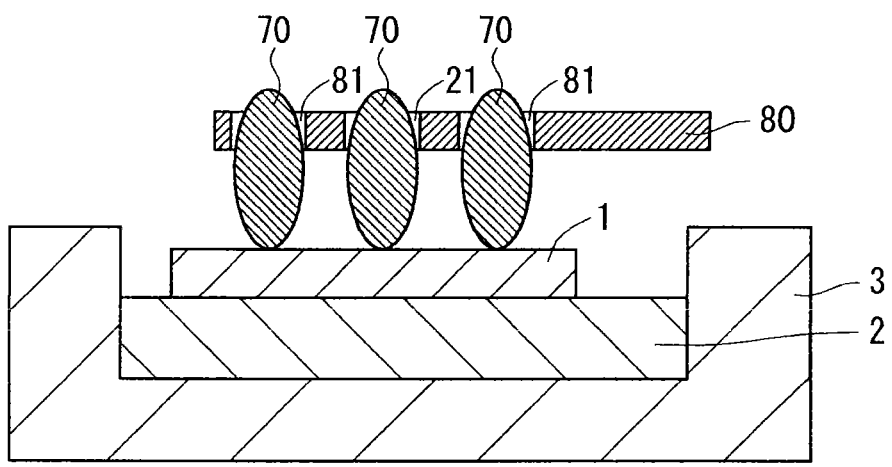
FIG. 12 is a cross-sectional view showing the structure in a tentatively assembled state in a joining method according to a sixth preferred embodiment of the present invention.
Figure 13:
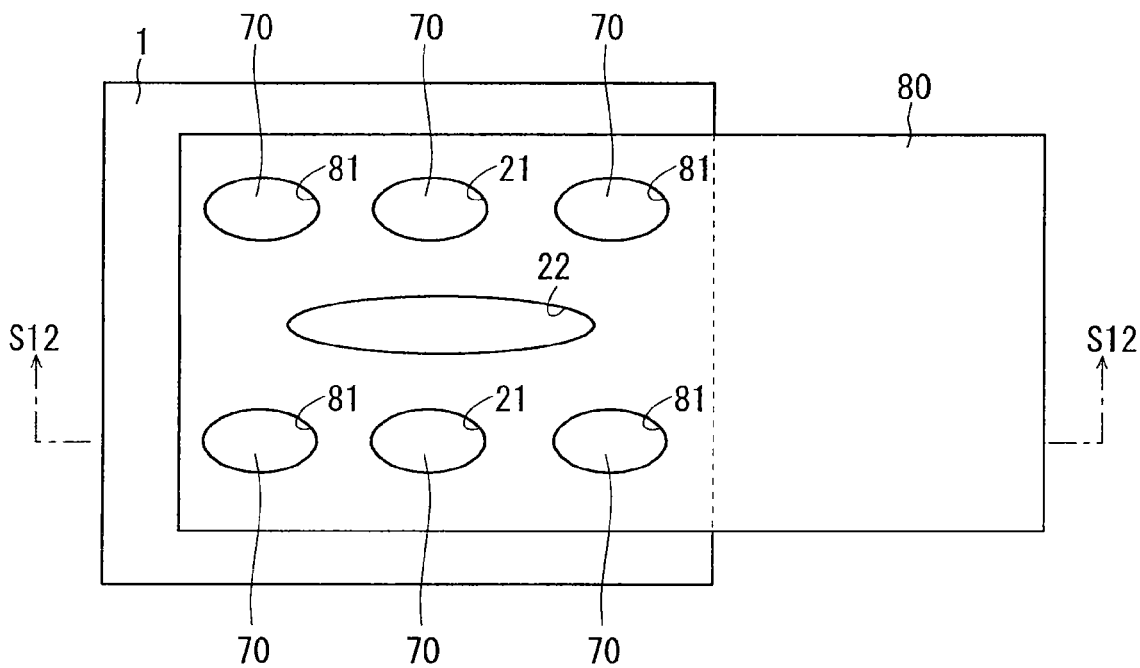
FIG. 13 is a plan view showing the structure in a tentatively assembled state in the joining method according to the sixth preferred embodiment of the present invention.

FIG. 12 is a cross-sectional view showing the structure in a tentatively assembled state in a joining method according to a sixth preferred embodiment of the present invention. FIG. 13 is a plan view showing the structure in the tentatively assembled state in the joining method according to the sixth preferred embodiment of the present invention. FIG. 12 corresponds to a cross-sectional view taken along cross-sectional line S12-S12 in FIG. 13. Since the structure in the tentatively assembled state according to the present preferred embodiment is similar to the structure in the tentatively assembled state according to the fifth preferred embodiment described above, a description will be given of the different parts, and the corresponding parts are denoted by identical reference symbols and the common description will not be repeated.

In the present preferred embodiment, a lead frame 80 provided with solder supply ports (which hereinafter may be referred to as the "end solder supply ports") 81 at positions opposing to the end of the chip 1 is used. The lead frame 80 according to the present preferred embodiment is structured to include the lead frame 5 according to the fifth preferred embodiment and the additional end solder supply ports 81. In the present preferred embodiment, four end solder supply ports 81 are formed at the lead frame 80. In the following, the solder supply ports 21 formed as being aligned with the slit 22 similarly to the solder supply ports 21 formed at the lead frame 5 according to the fifth preferred embodiment may be referred to as the "inner solder supply ports 21".

Similarly to the inner solder supply ports 21, the end solder supply ports 81 penetrate through the lead frame 80 in the thickness direction. Similarly to the inner solder supply ports 21, the end solder supply ports 81 are each formed in an oval shape as seen from the other side in the thickness direction of the lead frame 80. The end solder supply ports 81 are formed two in number on each of the opposite sides in the shorter side direction of the slit 22, with reference to the slit 22. One end solder supply port 81, one inner solder supply port 21, and the other one end solder supply port 81 are aligned along the longitudinal direction of the slit 22. Each of the end solder supply port 81 is formed at a position opposing to the end of the chip 1.

The joining method according to the present preferred embodiment is similarly performed as the joining method according to the fifth preferred embodiment described above. Specifically, in Step c1 shown in FIG. 10 described above, the chip 1 is soldered to the heat spreader 2, and assembled into the dedicated jig 3. In Step c2, similarly to the fifth preferred embodiment, the chip 1 and the lead frame 80 are tentatively assembled.

Thereafter, in Step c3, similarly to the fifth preferred embodiment, the solid solder 70 is inserted into each of the solder supply ports 21 and 81 of the lead frame 80. Subsequently, in Step c4, the tentatively assembled chip 1 and the lead frame 80 are fed into the reflow oven, whereby the solid solder 70 inserted into the solder supply ports 21 and 81 are heated and melted. Thereafter, the tentatively assembled chip 1 and the lead frame 80 are taken out from the reflow oven and cooled, so that the molten solid solder 70 is solidified. Thus, the chip 1 and the lead frame 80 are joined to each other.

As described above, in the present preferred embodiment, similarly to the first and fifth preferred embodiments described above, the solder is supplied by inserting the solid solder 70 into the solder supply ports 21 and 81 of the lead frame 80 before the chip 1 and the lead frame 80 are fed into the reflow oven. This achieves the effect similar to that of the first and fifth preferred embodiments in that the joining processing can simultaneously be carried out at a plurality of portions without being influenced by the supply time restriction on the solder in the reflow oven.

Further, the lead frame 80 according to the present preferred embodiment is provided with end solder supply ports 81 at positions opposing to the ends of the chip 1. This makes it possible to directly supply the solder to the ends of the chip 1, whereby insufficient wetting of the solder at the ends of the chip 1 can be prevented.

Though the solid solder 70 in a specific shape is used in the above-described present preferred embodiment similarly to the fifth preferred embodiment described above, without being limited thereto, the solder in other shape such as the cut solder wire 71 described above and shown in FIG. 11 may also be used. In this case also, the effect similar to that achieved by the present preferred embodiment can be achieved.

Seventh Preferred Embodiment

Figure 14:
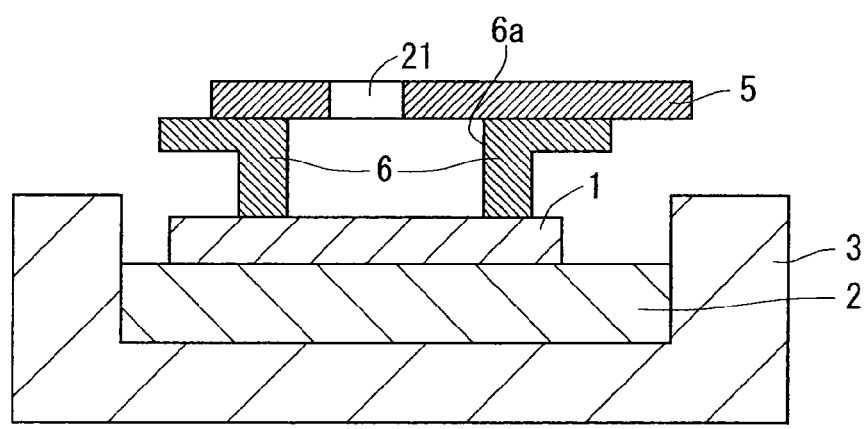
FIG. 14 is a cross-sectional view showing the structure in a tentatively assembled state in a joining method according to a seventh preferred embodiment of the present invention.

FIG. 14 is a cross-sectional view showing the structure in a tentatively assembled state in a joining method according to a seventh preferred embodiment of the present invention. In the present preferred embodiment, joining is carried out by supplying molten solder in the reflow oven, in place of use of the solder block 4 in the first preferred embodiment described above. To this end, in the present preferred embodiment, being different from the first preferred embodiment, a non-joining portion that is the portion not to be joined is covered by a mask 6 made of a material that does not join with the solder, and the molten solder is supplied from the opening portion 6a of the mask 6.

Figure 15:
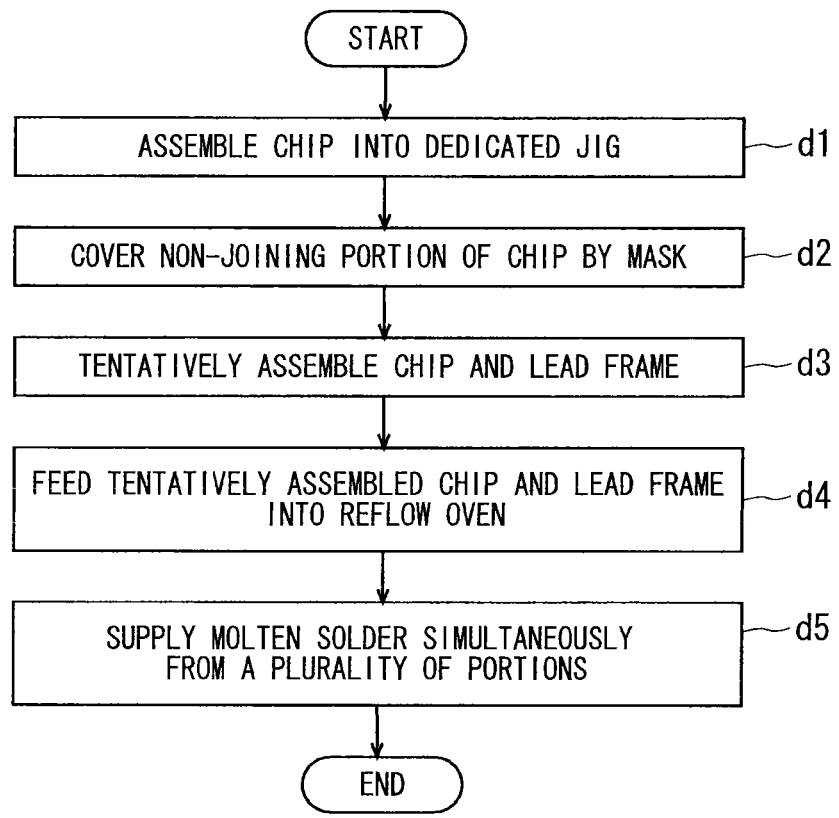
FIG. 15 is a flowchart showing the processing procedure in the joining method according to the seventh preferred embodiment of the present invention.

FIG. 15 is a flowchart showing the processing procedure in a joining method according to a seventh preferred embodiment of the present invention. When materials and tools used in the joining method according to the present preferred embodiment, such as the chip 1, the heat spreader 2, the dedicated jig 3, the lead frame 5, the mask 6 and the like shown in FIG. 14, are prepared, the processing starts and proceeds to Step d1.

In Step d1, similarly to the first preferred embodiment described above, after the chip 1 is soldered to the heat spreader 2, the heat spreader 2 to which the chip 1 is soldered is assembled into the dedicated jig 3.

In Step d2, the non-joining portion of the chip 1 is covered by the mask 6. In Step d3, the lead frame 5 is placed on the chip 1 having the mask 6 interposed therebetween, and the chip 1 and the lead frame 5 are tentatively assembled. The lead frame 5 is supported by not-shown supporting means, e.g., a robot arm or a fixing member, and placed on the chip 1.

After the tentative assembly, in Step d4, the tentatively assembled chip 1 and lead frame 5 are fed into the reflow oven. In Step d5, in the reflow oven, from a plurality of portions, specifically, from the two solder supply ports 21 of the lead frame 5, the molten solder is supplied simultaneously by being poured into the opening portion 6a of the mask 6.

Thereafter, the tentatively assembled chip 1 and lead frame 5 are taken out from the reflow oven and cooled, so that the molten solder solidifies. Thus, the chip 1 and the lead frame 5 are joined to each other. Thereafter, the mask 6 is peeled off.

As described above, in the present preferred embodiment, since the molten solder is supplied in the state where the non-joining portion is covered by the mask 6, the joining processing can simultaneously be carried out at a plurality of portions without being influenced by the supply time restriction on the solder in the reflow oven. In other words, the joining processing can be carried out simultaneously at a plurality of portions, just by adjusting the shape of the mask 6. Accordingly, since it is not necessary to perform works to the chip 1 or the lead frame 5 for realizing the joining processing, the joining processing at a plurality of portions can easily be carried out even when the joining portions are relatively great in number.

The material of the mask 6 may be any material that does not join with solder, e.g., stainless steel. By forming the mask 6 with a material that does not join with solder, the effect described above can be achieved with the mask 6 of various shapes.

Eighth Preferred Embodiment

Figure 16:
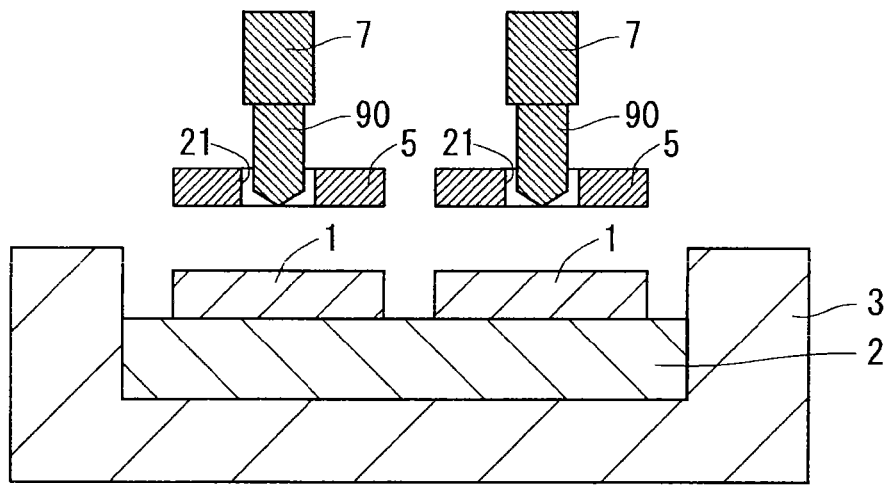
FIG. 16 is a cross-sectional view showing the structure in a solder supplying state in a reflow oven in a joining method according to an eighth preferred embodiment of the present invention.

FIG. 16 is a cross-sectional view showing the structure in a solder supplying state in the reflow oven in a joining method according to an eighth preferred embodiment of the present invention. Since the structure of the present preferred embodiment is similar to the structure of the first preferred embodiment described above, a description will be given of the different parts, and the corresponding parts are denoted by identical reference symbols and the common description will not be repeated.

In the present preferred embodiment, the lead frames 5 are respectively joined to a plurality of the chips 1. In the present preferred embodiment, being different from the first preferred embodiment described above, without assembling the solder block 4, the chips 1 and respective corresponding lead frames 5 are tentatively assembled, and fed into the reflow oven. Then, in the reflow oven, molten solder 90 is simultaneously supplied to the chips 1 from a plurality of solder supply sources 7.

Figure 17:
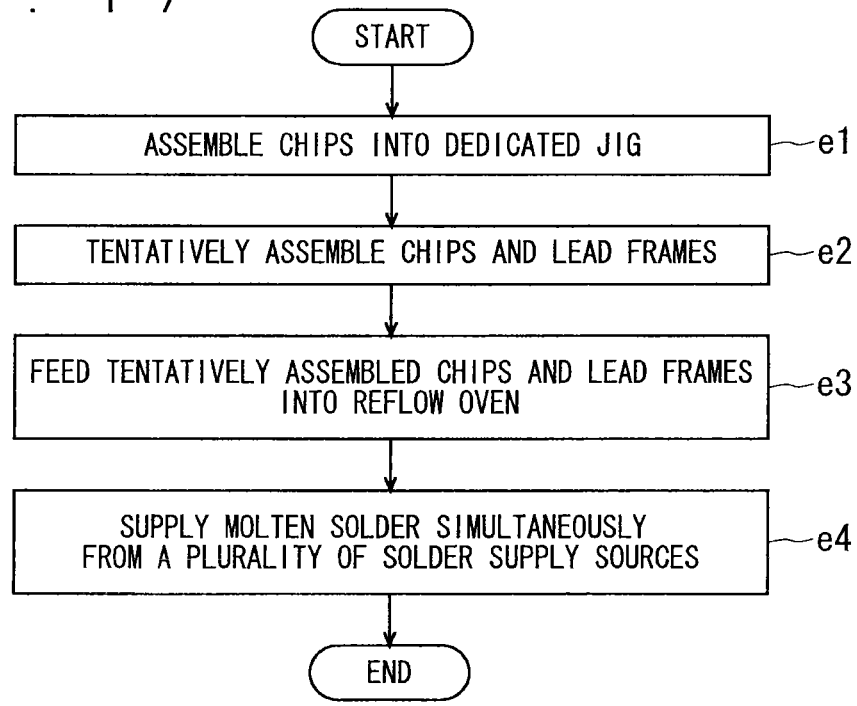
FIG. 17 is a flowchart showing the processing procedure in the joining method according to the eighth preferred embodiment of the present invention.

FIG. 17 is a flowchart showing the processing procedure in a joining method according to the eighth preferred embodiment of the present invention. When materials and tools used in the joining method according to the present preferred embodiment, such as the chips 1, the heat spreader 2, the dedicated jig 3, the lead frames 5 and the like shown in FIG. 16 are prepared, the processing starts and proceeds to Step e1.

In Step e1, similarly to the first preferred embodiment described above, after the chips 1 are soldered to the heat spreader 2, the heat spreader 2 to which the chips 1 are soldered is assembled into the dedicated jig 3.

In Step e2, the lead frames 5 are placed above the chips 1 without having any solder block 4 interposed therebetween, and the chips 1 and the lead frames 5 are tentatively assembled. The lead frames 5 are supported by not-shown supporting means, for example by a robot arm or a fixing member, and placed above the chips 1.

After the tentative assembly, in Step e3, the tentatively assembled chips 1 and lead frames 5 are fed into the reflow oven. In Step e4, in the reflow oven, simultaneously from a plurality of solder supply sources 7, the molten solder 90 is supplied. Thereafter, the tentatively assembled chips 1 and lead frames 5 are taken out from the reflow oven and cooled, so that the molten solder 90 solidifies. Thus, the chips 1 and the lead frames 5 are joined to each other.

As described above, in the present preferred embodiment, since the molten solder 90 is supplied simultaneously from a plurality of solder supply sources 7 to the chips 1, the joining processing can simultaneously be carried out at a plurality of portions without being influenced by the supply time restriction on the solder in the reflow oven.

Ninth Preferred Embodiment

Figure 18:
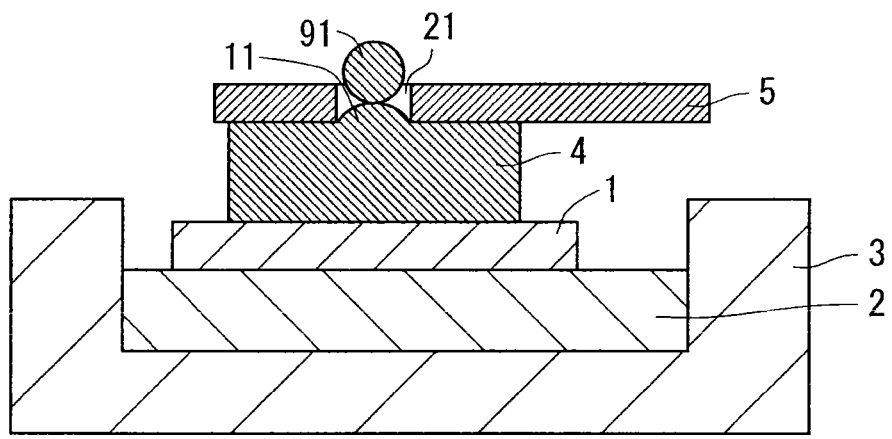
FIG. 18 is a cross-sectional view showing the structure in a tentatively assembled state in a joining method according to a ninth preferred embodiment of the present invention.

FIG. 18 is a cross-sectional view showing the structure in a tentatively assembled state in a joining method according to a ninth preferred embodiment of the present invention. Since the structure of the present preferred embodiment described above is similar to the structure of the first preferred embodiment, a description will be given of the different parts, and the corresponding parts are denoted by identical reference symbols and the common description will not be repeated.

In the present preferred embodiment, the solder block 4 being solid solder is supplied between the chip 1 and the lead frame 5 similarly to the first preferred embodiment described above, and additionally, after the tentative assembly, solder balls 91 are supplied from the solder supply ports 21, and they are fed into the reflow oven. The solder balls 91 each correspond to the spherical joining material.

In the present preferred embodiment, the effect similar to that achieved by the first preferred embodiment described above can be achieved. Further, in the present preferred embodiment, by supplying the solder balls 91, the supply amount of solder is increased as compared to the first preferred embodiment. Accordingly, the joining method of the present preferred embodiment is particularly effective when the joining area is relatively great.

Figure 19:
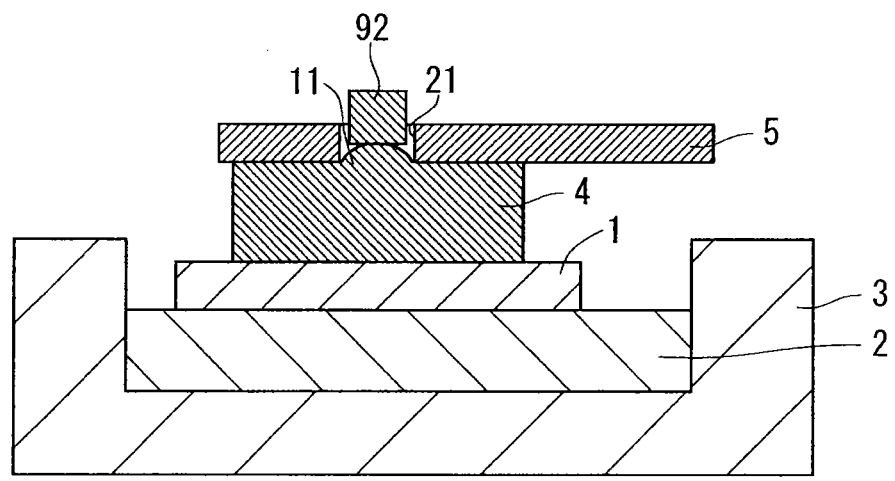
FIG. 19 is a cross-sectional view showing other example in a tentatively assembled state in a joining method according to a modification of the ninth preferred embodiment of the present invention.

FIG. 19 is a cross-sectional view showing the structure in a tentatively assembled state in a joining method according to a modification of the ninth preferred embodiment of the present invention. As shown in FIG. 19, in the modification of the ninth preferred embodiment, in place of the solder balls 91, solder wires 92 having been cut may be used. The solder wires 92 each correspond to the wire-like joining material. Further, in place of the solder block 4, the plate solder 31 according to the second preferred embodiment may be used. In the cases where they are used also, the effect similar to that achieved by the ninth preferred embodiment can be achieved.

Tenth Preferred Embodiment

Figure 20:
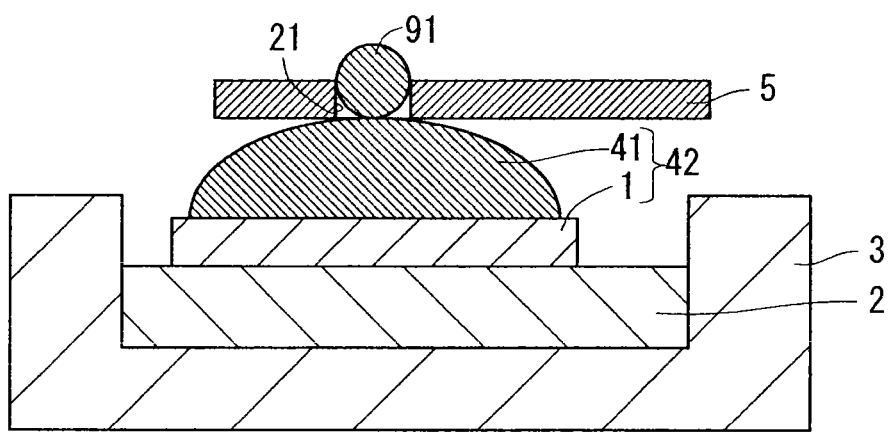
FIG. 20 is a cross-sectional view showing the structure in a tentatively assembled state in a joining method according to a tenth preferred embodiment of the present invention.

FIG. 20 is a cross-sectional view showing the structure in a tentatively assembled state in a joining method according to a tenth preferred embodiment of the present invention. Since the structure in the tentatively assembled state of the present preferred embodiment is similar to the structure in the tentatively assembled state according to the third preferred embodiment described above, a description will be given of the different parts, and the corresponding parts are denoted by identical reference symbols and the common description will not be repeated.

In the present preferred embodiment, the soldered chip 42 is used similarly to the third preferred embodiment, and additionally, after the tentative assembly, the solder balls 91 are supplied from the solder supply ports 21 and they are fed into the reflow oven similarly to the ninth preferred embodiment. The solder balls 91 each correspond to the spherical joining material.

According to the present preferred embodiment, the effect that is similar to that achieved by the third preferred embodiment described above can be achieved. Further, similarly to the ninth preferred embodiment, by supplying the solder balls 91, the supply amount of solder is increased as compared to the third preferred embodiment. Accordingly, the joining method according to the present preferred embodiment is particularly effective when the joining area is relatively great.

Though it is different from the present preferred embodiment, use of the lead frame 80 with additional solder supply ports 81 as in the sixth preferred embodiment described above can achieve the similar effect.

The joining methods according to the first to tenth preferred embodiments described above can be used in combination as appropriate. For example, by combining the joining method according to the first preferred embodiment and the joining method according to the fourth preferred embodiment, it becomes possible to join the joining target members at the accurate position while suppressing the use amount of the solder.

A semiconductor device manufacturing method according to the other embodiment of the present invention includes a step of joining the semiconductor chip 1 and the lead frame 5 to each other using one of the joining methods according to the first to tenth preferred embodiments described above. The semiconductor chip 1 includes a semiconductor element. The lead frame 5 includes a lead wire connected to the semiconductor element to each other. Joining the semiconductor chip 1 and the lead frame 5 specifically means joining the semiconductor element of the semiconductor chip 1 and the lead wire of the lead frame 5 to each other.

As described above, according to the joining methods of the first to tenth preferred embodiments, the joining processing can simultaneously be carried out at a plurality of portions without being influenced by the supply time restriction on the joining material. By joining the semiconductor chip 1 and the lead frame 5 to each other through use of such joining methods, the number of semiconductor chips 1 mounted on a semiconductor device can be increased.

While the invention has been shown and described in detail, the foregoing description is in all aspects illustrative and not restrictive. It is therefore understood that numerous modifications and variations can be devised without departing from the scope of the invention.

What is claimed is:
1. A joining method for joining two joining target members, comprising:
    a tentative assembling step of tentatively assembling said two joining target members to oppose to each other with an interval between said two joining target members; and a joining step of joining said two joining target members by supplying a molten joining material using supplying means to a space formed by said two joining target members and thereafter solidifying the molten joining material, wherein said supplying means is structured to be capable of simultaneously supplying said joining material to a plurality of portions, wherein said supplying means includes:

a mask that exposes a portion to be joined of each of said two joining target members and that covers other portion; and a supply source that supplies said molten joining material, wherein said tentative assembling step is a step of tentatively assembling said two joining target members by having said mask interposed between and contacting said two joining target members, and in said joining step, said molten joining material is supplied from said supply source to said portion to be joined being exposed outside said mask.

2. The joining method according to claim 1, wherein said supplying means includes a plurality of supply sources that each supply said molten joining material, wherein in said joining step, said plurality of supply sources each supply said molten joining material into a space formed by said two joining target members.

* * * * *